(12) United States Patent
Beardsley et al.

(10) Patent No.: US 6,387,810 B2
(45) Date of Patent: *May 14, 2002

(54) METHOD FOR HOMOGENIZING DEVICE PARAMETERS THROUGH PHOTORESIST PLANARIZATION

(75) Inventors: Gary J. Beardsley, Underhill; Zhong X. He, Essex Junction; Cuc K. Huynh, Jericho; Michael P. McMahon, Williston, all of VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/340,796
(22) Filed: Jun. 28, 1999
(51) Int. Cl.[7] .............................................. H01L 21/304
(52) U.S. Cl. ..................... 438/691; 438/692; 438/696; 438/697
(58) Field of Search ................. 438/690, 691, 438/692, 706, 725, 434, 435, 424, 445

(56) References Cited

U.S. PATENT DOCUMENTS

| | | | | |
|---|---|---|---|---|
| 3,605,260 A | * | 9/1971 | Spridco et al. ................ 29/625 |
| 3,649,274 A | * | 3/1972 | Older et al. .................. 96/36.2 |
| 3,791,858 A | * | 2/1974 | McPherson et al. ........ 117/201 |
| 3,922,479 A | * | 11/1975 | Older et al. ................ 174/68.5 |
| 4,552,615 A | * | 11/1985 | Amendola et al. ........ 158/659.1 |
| 4,568,601 A | * | 2/1986 | Araps et al. ................. 428/167 |
| 4,589,193 A | * | 5/1986 | Goth et al. .................... 29/576 |
| 4,702,792 A | * | 10/1987 | Chow et al. ................. 156/628 |
| 4,944,836 A | * | 7/1990 | Beyer et al. ................. 156/645 |
| 5,091,289 A | * | 2/1992 | Cronin et al. ............... 430/312 |
| 5,096,849 A | * | 3/1992 | Beilstein et al. ............ 438/386 |
| 5,406,111 A | * | 4/1995 | Sum ............................ 257/497 |
| 5,500,073 A | * | 3/1996 | Barbee et al. ............... 156/345 |
| 5,527,423 A | * | 6/1996 | Neville et al. ............... 156/636 |
| 5,652,693 A | * | 7/1997 | Chou et al. ............... 361/306.1 |
| 5,656,535 A | * | 8/1997 | Ho et al. ..................... 438/386 |
| 5,683,945 A | * | 11/1997 | Penner et al. ............... 438/386 |
| 5,718,618 A | * | 2/1998 | Guckel et al. ................. 451/41 |
| 5,731,245 A | * | 3/1998 | Joshi et al. .................. 438/705 |
| 5,780,353 A | * | 7/1998 | Omid-Zohoor ............. 438/433 |
| 5,858,813 A | * | 1/1999 | Scherber et al. ............ 438/693 |
| 5,874,347 A | * | 2/1999 | Ryum et al. ................. 438/445 |
| 6,004,830 A | * | 12/1999 | Potter ........................... 438/20 |

OTHER PUBLICATIONS

D.J. Sheldon, et al., "Application of a Two–Layer Planarization Process to VLSI Intermetal Dielectric and Trench Isolation Processes", Nov. 1988, vol. 1, No. 4, pp. 140–146.*

* cited by examiner

Primary Examiner—Felisa Hiteshew
Assistant Examiner—Lan Vinh
(74) Attorney, Agent, or Firm—Schmeiser, Olsen & Watts

(57) ABSTRACT

In a fabrication process, photoresist is disposed over a semiconductor substrate (10), covering a front surface (11) of the substrate (10) and filling trenches (12, 14, 16, 18) therein. The photoresist is planarized in chemical mechanical polishing to achieve a uniform thickness throughout the substrate (10). An anisotropic etching process partially removes the photoresist in the trenches (12, 14, 16, 18), thereby creating recesses in the trenches (12, 14, 16, 18). Because the thickness of the photoresist is uniform throughout the substrate (10) before the etching process, the depths of the recesses in different trenches (12, 14, 16, 18) are substantially equal to each other. A uniform recess depth throughout the substrate (10) is thereby achieved. The uniform recess depth facilitates in ensuring the semiconductor devices fabricated on the substrate (10) to have consistent parameters, characteristics, and performances.

12 Claims, 3 Drawing Sheets

METHOD FOR HOMOGENIZING DEVICE PARAMETERS THROUGH PHOTORESIST PLANARIZATION

FIELD OF THE INVENTION

The present invention relates, in general, to semiconductor device fabrication processes and, more particularly, to processes for achieving consistent device characteristics on a semiconductor substrate.

BACKGROUND OF THE INVENTION

The fabrication of semiconductor devices often includes forming doped regions near trenches on a semiconductor wafer. For example, in a dynamic random access memory (DRAM) fabrication process, deep trenches are formed in a semiconductor wafer. A dopant containing oxide layer is deposited on the semiconductor wafer. The oxide layer covers the front surface of the wafer as well as the sidewalls and bottoms of the trenches. In a spin-on process, photoresist is applied to the wafer, covering the dopant containing oxide layer and filling the trenches. A dry etching process removes the photoresist over the wafer front surface. The etching process also removes upper portions of the photoresist filling the trenches, thereby creating recesses in the trenches. The recesses expose the dopant containing oxide layer on the upper portions of the sidewalls in the trenches, which is subsequently removed in an oxide etching process. The photoresist in the lower portions of the trenches is then etched away. The wafer goes through an annealing process, in which the dopant in the oxide layer diffuses into the semiconductor substrate, forming doped regions along the lower portions of the trenches. The upper boundaries of the doped regions in the trenches are recessed from the front surface of the wafer.

Because of process variation, the thickness of the photoresist is usually not uniform over the wafer. The dry etch process translates the inhomogeneous photoresist thickness into inhomogeneous recesses in the trenches. Consequently, the recesses of the upper boundaries of the doped regions vary from trenches to trenches. In other words, the recess depths of the doped regions in different trenches are different from each other. The inhomogeneity in the recess depths may adversely affect the characteristics, performance, and reliability of the fabricated DRAM. It may also affect the yield of the fabrication process.

Accordingly, it would be advantageous to have a method or a process for controlling the recess depth in trench to achieve substantially homogenized device parameters throughout a semiconductor die or a semiconductor wafer. It is desirable for the method to be simple and reliable. It would be of further advantage for the process to be compatible with conventional fabrication processes.

SUMMARY OF THE INVENTION

A general object of the present invention is to provide a reliable semiconductor device fabrication process to homogenize semiconductor device parameters and achieve substantially uniform device characteristics. More particularly, an object of the present invention is to control the photoresist recess depth in trenches in a semiconductor wafer, thereby achieving a substantially uniform recess depth in trenches throughout the wafer. It is a further object of the present invention for the fabrication process to be simple reliable, and compatible with other semiconductor device fabrication processes.

These and other objects of the present invention are achieved by planarizing the photoresist disposed over a semiconductor wafer, thereby controlling the thickness of the photoresist over the wafer. For example, in a fabrication process in accordance with the present invention, photoresist is applied over a semiconductor wafer with trenches formed therein. The photoresist covers the front surface of the semiconductor wafer and fills the trenches. The disposed photoresist is planarized in a chemical mechanical polishing process to achieve a substantially uniform thickness throughout the wafer. After the planarization, an anisotropic etching process such as, for example, a reactive ion etching process partially removes the photoresist in the trenches, thereby creating recesses in the trenches. Because the thickness of the photoresist is substantially uniform throughout the wafer before the etching process, the depths of the recesses in different trenches in the wafer are substantially equal to each other. Therefore, a substantially uniform recess depth throughout the wafer is achieved. The uniform recess depth significantly facilitates in ensuring that the semiconductor devices fabricated on the wafer have consistent characteristics and performances.

BRIEF DESCRIPTION OF THE DRAWINGS

It should be further noted that the figures are not necessarily drawn to scale and that elements having similar functions are labeled using the same reference numerals in the figures.

DETAILED DESCRIPTION OF THE PREFERRED EMBODIMENTS

Preferred embodiments of the present invention are described herein with reference to the figures. It should be noted that the figures are merely schematic representations, which are not intended to portray specific parameters of the present invention. It should also be noted that the figures are intended to depict only typical embodiments of the present invention. Therefore, the figures should not be considered as limiting the scope of the present invention.

Figure 1:
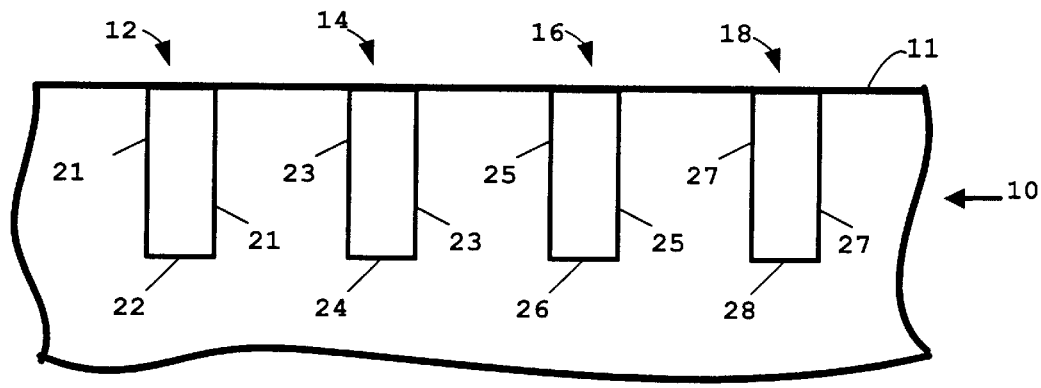
FIGS. 1, 2, 3, 4, 5, 6, 7, 8 and 9 are cross-sectional views of a semiconductor substrate at various stages of a fabrication process in accordance with the present invention.

FIG. 1 is a cross-sectional view of a semiconductor substrate 10 that can be used in a fabrication process in accordance with the present invention. Substrate 10 is a portion of a semiconductor wafer (not shown), on which semiconductor devices will be fabricated. The semiconductor devices fabricated on substrate 10 can be discrete devices or integrated circuit devices. By way of example, semiconductor substrate 10 is a bulk silicon substrate. Semiconductor substrate 10 can also be a germanium substrate, a silicon germanium substrate, a silicon carbide substrate, a semiconductor on insulator (SOI) substrate, etc. Substrate 10 has a front surface 11, which is also referred to as a major surface of substrate 10. Trenches 12, 14, 16, and 18 formed in substrate 10 extend from front surface 11 partially into substrate 10. Trenches 12, 14, 16, and 18 can be either in the same die or in different dies on the wafer. Further, substrate 10 is not limited to having four trenches therein. In accordance with the present invention, substrate 10 can include any number of trenches, e.g., one, two, three, five, six, etc. Trench 12 has a sidewall 21 and a bottom 22, trench 14 has a sidewall 23 and a bottom 24, trench 16 has a sidewall 25 and a bottom 26, and trench 18 has a sidewall 27 and a bottom 28. By way of example, the heights of sidewalls 21, 23, 25, and 27 are greater than the dimensions of bottoms 22, 24, 26, and 28, respectively. Accordingly, trenches 12, 14, 16, and 18 are referred to as deep trenches. However, this is not a limitation of the present invention. In other words, trenches 12, 14, 16, and 18 are not limited to being deep trenches. Further, the dimensions of trenches 12, 14, 16, and 18 can either be the same as each other or be different from each other.

Figure 2:
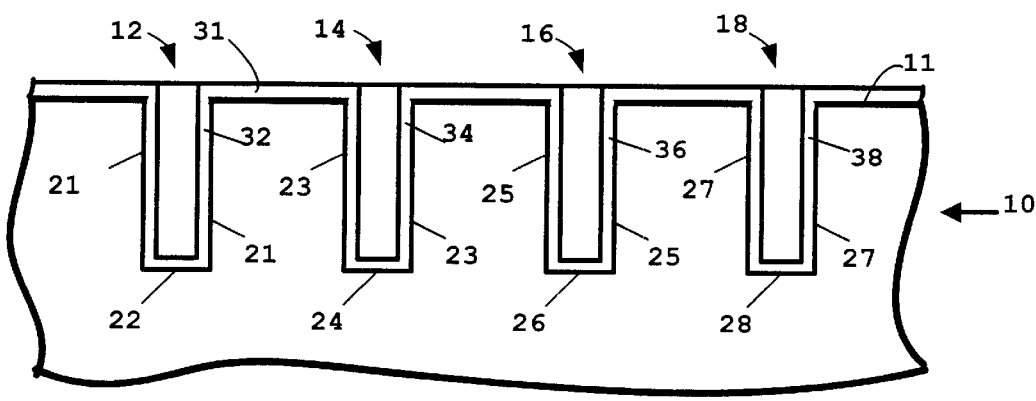
Figure 3:
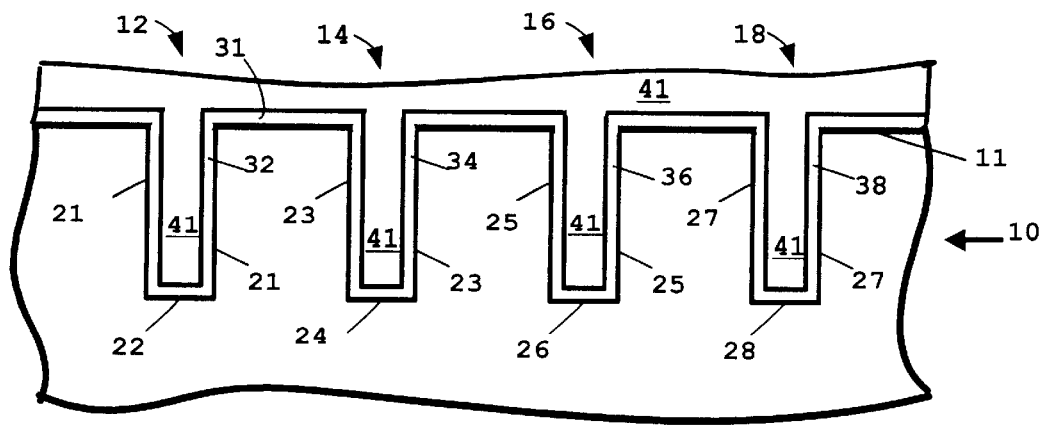

Referring now to FIG. 2, a dielectric layer 31 is disposed over front surface 11 of substrate 10. By way of example, dielectric layer 31 contains a dopant and is disposed over substrate 10 in a chemical vapor deposition process. Dielectric layer 31 can be an oxide layer, a nitride layer, etc. The dopant contained in dielectric layer 31 can be either a P type dopant, e.g., boron, or an N type dopant, e.g., phosphorus or arsenic. The chemical vapor deposition process that forms dielectric layer 31 also forms dielectric layer 32 in trench 12, dielectric layer 34 in trench 14, dielectric layer 36 in trench 16, and dielectric layer 38 in trench 18. FIG. 3 shows substrate 10 at a subsequent stage of the fabrication process. A photoresist material is applied or disposed over substrate 10, forming photoresist structure 41 covering dielectric layer 31 over front surface 11. Photoresist structure 41 also fills trenches 12, 14, 16, and 18 in substrate 10. By way of example, the photoresist material is deposited over substrate 10 to form photoresist structure 41 in a spin-on process known in the art. Because of process variation, the thickness of photoresist structure 41 over substrate 10 is usually not uniform over substrate 10. For example, FIG. 3 shows that the thickness of photoresist structure 41 overlying trench 18 is greater than that overlying trench 14. The inhomogeneous photoresist thickness often results in nonuniform parameters and characteristics of the semiconductor devices fabricated on substrate 10. The characteristics, performance, and reliability of the semiconductor devices will potentially be adversely affected by this inhomogeneity, and so will the yield of the fabrication process.

Figure 4:
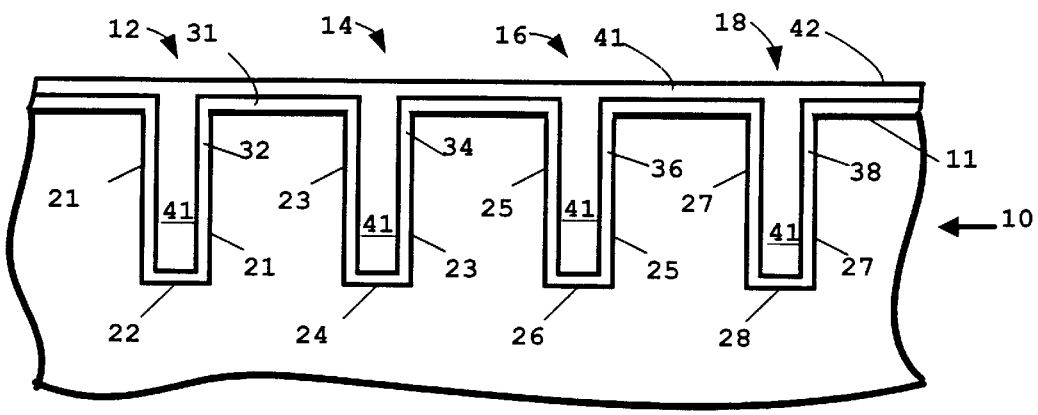

In order to avoid inhomogeneous or nonuniform device parameters and characteristics, photoresist structure 41 is planarized to achieve a substantially uniform thickness over substrate 10. After planarization, photoresist structure 41 has a planar surface 42 as shown in FIG. 4. Preferably, the planarization of photoresist structure 41 is accomplished using a chemical mechanical polishing process. In one embodiment shown in FIG. 4, the polish stops before photoresist structure 41 covering dielectric layer 31 on front surface 11 is depleted. In this embodiment, there is still a thin and uniform layer of photoresist covering dielectric layer 31 after the polish. In an alternative embodiment, the polish continues until photoresist structure 41 covering dielectric layer 31 over front surface 11 is substantially depleted and planar surface 42 of photoresist structure 41 substantially coincides with the surface of dielectric layer 31. In this alternative embodiment, the polish process is preferably highly selective so that dielectric layer 31 can serve as a polish stop layer. For example, photoresist structure 41 can be planarized in a polish process using a solution containing alumina ($Al_2O_3$) and ferric nitrate ($Fe(NO_3)_3$) as slurry. The alumina serves as an abrasive and the ferric nitrate serves as an oxidizer. The polishing rate of photoresist structure 41 in such a process is between approximately 2,000 nanometers per minute (nm/min) and approximately 4,000 nm/min. The polish selectivity between the photoresist and an oxide material, e.g., phosphorus silicate glass (PSG), is usually greater than approximately 200:1. The polish selectivity between the photoresist and a silicon nitride material, e.g., silicon nitride formed in a low pressure chemical vapor deposition (LPCVD) process, is usually greater than approximately 2,000:1. Therefore, dielectric layer 31 under photoresist structure 41 can function as a effective polish stop layer regardless whether it is an oxide layer or a nitride layer. A polish that continues after photoresist structure 41 covering dielectric layer 31 is depleted is referred to as an overpolish. Because of the high polish selectivity, the overpolish will result in a small reduction in the thickness of dielectric layer 31 without significant effect on photoresist structure 41 remaining in trenches 12, 14, 16, and 18.

Figure 5:
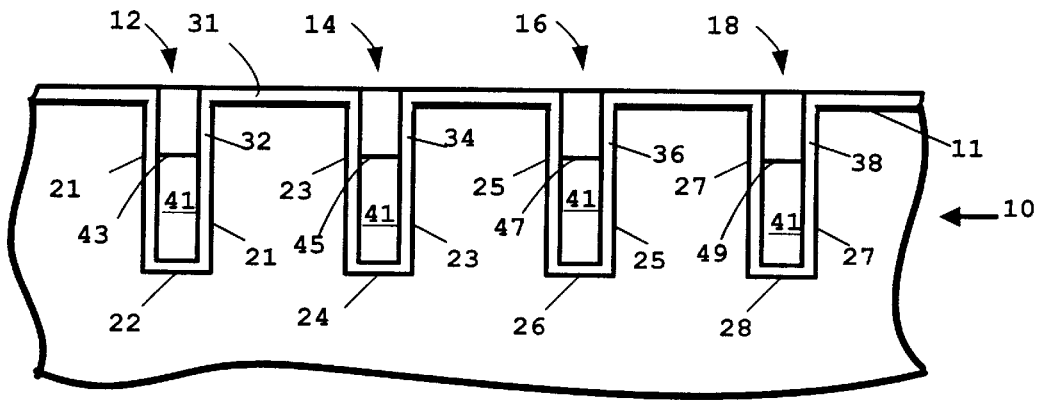

Referring now to FIG. 5, a photoresist etching process is performed to remove the photoresist in the top portions of trenches 12, 14, 16, and 18, thereby creating a recess in each of trenches 12, 14, 16, and 18. Preferably, the photoresist is etched in an anisotropic dry etching process such as, for example, a reactive ion etching process or a chemical downstream etching process. The recessed photoresist has top surfaces 43, 45, 47, and 49 in trenches 12, 14, 16, and 18, respectively. The recesses expose top portions of dielectric layers 32, 34, 36, and 38 in respective trenches 12, 14, 16, and 18 adjacent front surface 11 of substrate 10. The distances between front surface 11 of substrate 10 and top surfaces 43, 45, 47, and 49 are referred to as photoresist recess depths in respective trenches 12, 14, 16, and 18. The photoresist recess depths depend on the composition of the etchant used in the etching process and the duration of the etching process. Because photoresist structure 41 is planarized before the etching process, the photoresist recess depths in trenches 12, 14, 16, and 18 are substantially equal to each other. In other words, the planarization of photoresist structure 41 establishes a substantially uniform or homogeneous photoresist recess depth throughout substrate 10. This homogeneous photoresist recess depth will improve the consistency and uniformity in the parameters and characteristics of the semiconductor devices fabricated on substrate 10.

Figure 6:
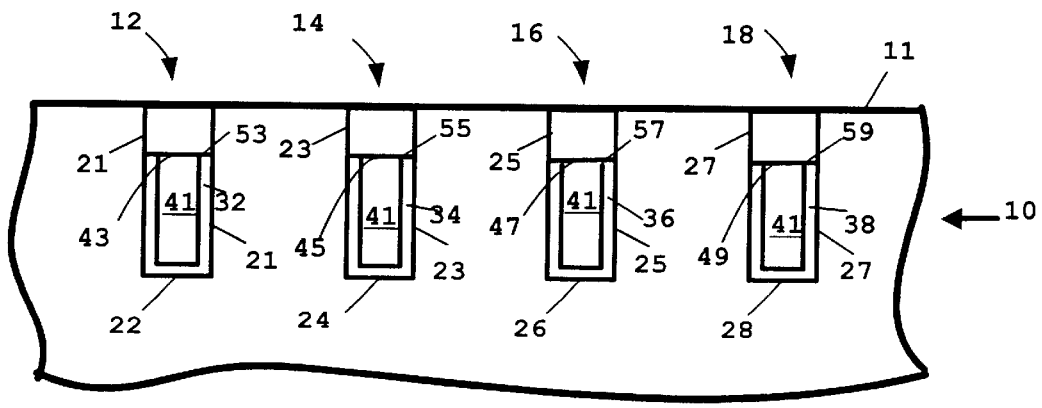
Figure 7:
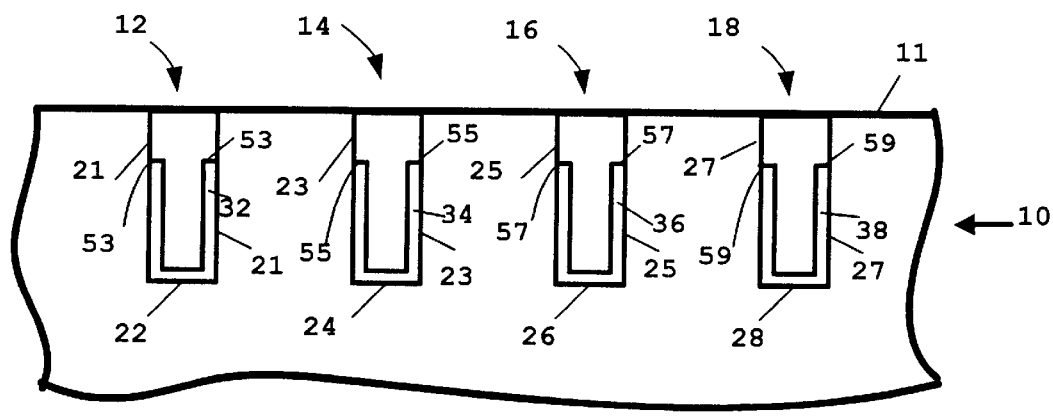
Figure 8:
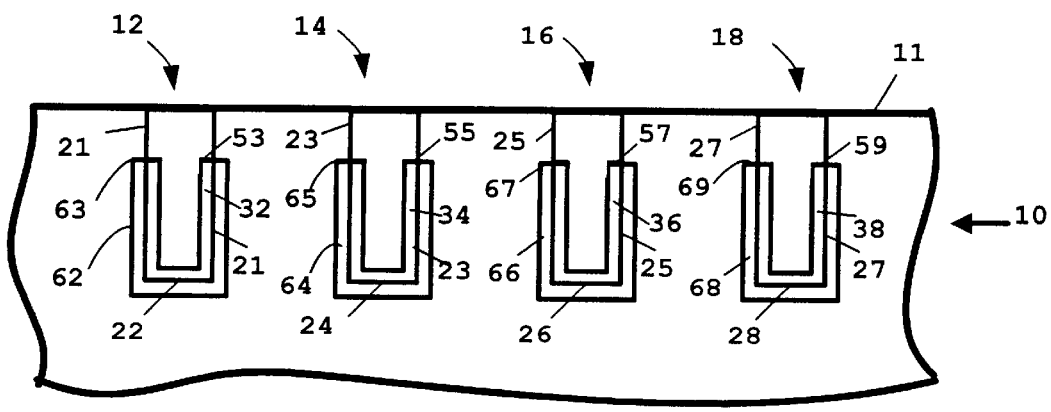
Figure 9:
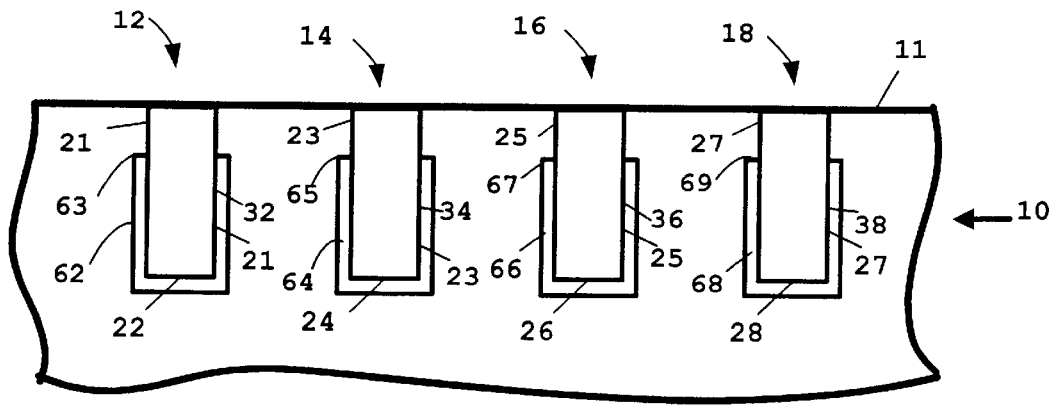

Continuing the fabrication process, the exposed portions of dielectric layers 32, 34, 36, and 38 are removed (FIG. 6) in an etching process that preferably has a high selectivity toward dielectric materials over photoresist. Dielectric layer 32 remaining in trench 12 has an upper surface 53 substantially coinciding with upper surface 43 of photoresist structure 41 in trench 12. Likewise, dielectric layer 34 in trench 14 has an upper surface 55 substantially coinciding with upper surface 45 of photoresist structure 41 in trench 14. Further, dielectric layer 36 in trench 16 has an upper surface 57 substantially coinciding with upper surface 47 of photoresist structure 41 in trench 16. In addition, dielectric layer 38 in trench 18 has an upper surface 59 substantially coinciding with upper surface 49 of photoresist structure 41 in trench 18. Thus, the recess depths of dielectric layers 32, 34, 36, and 38 in respective trenches 12, 14, 16, and 18 are substantially equal to each other. The photoresist in trenches 12, 14, 16, and 18 is subsequently completely removed (FIG. 7) in an etching process that preferably has a high selectivity toward the photoresist over the dielectric materials. Dielectric layers 32, 34, 36, and 38 adjacent to corresponding bottoms 22, 24, 26, and 28 of respective trenches 12, 14, 16, and 18 are exposed. Semiconductor substrate 10 goes through thermal process such as, for example, an annealing process. During the thermal process, the dopant in dielectric layers 32, 34, 36, and 38 diffuses into substrate 10, forming doped regions 62, 64, 66, and 68 around the lower portions of respective trenches 12, 14, 16, and 18 (FIG. 8). Doped regions 62, 64, 66, and 68 have upper boundaries 63, 65, 67, and 69, respectively, adjacent front surface 11 of substrate 10. The distances between front surface 11 and upper boundaries 63, 65, 67, and 69 are referred to as recess depths of respective doped regions 62, 64, 66, and 68. In an optional step, dielectric layers 32, 34, 36, and 38 are etched away. As a result, semiconductor substrate 10 includes doped regions 62, 64, 66, and 68 around corresponding deep trenches 12, 14, 16, and 18 (FIG. 9). The fabrication process typically includes additional steps to form semiconductor devices on semiconductor substrate 10. Because dielectric layers 32, 34, 36, and 38 have a substantially uniform recess depth, the recess depths for upper boundaries 63, 65, 67, and 69 of respective doped regions 62, 64, 66, and 68 are substantially equal to each other. In other words, doped regions 62, 64, 66, and 68 adjacent respective trenches 32, 34, 36, and 38 have a substantially uniform recess depth.

By now it should be appreciated that a method or a process for controlling the recess depths in trenches to achieve a substantially uniform recess depth throughout a semiconductor substrate or a semiconductor wafer has been provided. In accordance with the present invention, the uniform recess depth is achieved by planarizing the photoresist structure disposed over the substrate. Preferably, the photoresist planarization is accomplished through a selective chemical mechanical polishing process. The photoresist planarization homogenizes the relevant geometric parameters, e.g., photoresist thickness, recess depth in the trenches, etc., throughout the semiconductor substrate. The photoresist planarization significantly facilitates in ensuring that the semiconductor devices fabricated on the substrate have consistent parameters, characteristics, and performances. The photoresist planarization process of the present invention is simple and reliable. Further, it is compatible with other semiconductor device fabrication processes.

While specific embodiments of the present invention have been shown and described, further modifications and improvements will occur to those skilled in the art. For example, the photoresist planarization process of the present invention is not limited to achieving uniform characteristics for doped regions around different trenches. The photoresist planarization process can also be used for achieving uniform geometric parameter of dielectric structures, e.g., interlayer dielectric structures, in different regions of a semiconductor wafer.

What is claimed is:

1. A fabrication process, comprising the steps of:
   providing a substrate having a plurality of trenches formed therein;
   disposing a photoresist structure over the substrate, the photoresist structure filling the plurality of trenches and forming a layer of photoresist having a substantially uniform thickness over the substrate;
   planarizing the photoresist structure disposed over the substrate such that a layer of photoresist having uniform thickness still remains over the substrate after planarizing;
   etching the planarized layer of photoresist from the substrate; and
   recessing the photoresist in the plurality of trenches, wherein the step of planarizing the photoresist structure establishes a substantially uniform recess depth in the plurality of trenches.

2. The fabrication process as claimed in claim 1, wherein the step of planarizing the photoresist structure includes planarizing the photoresist structure in a selective chemical mechanical polishing process.

3. The fabrication process as claimed in claim 1, wherein the step of planarizing the photoresist structure includes substantially removing the photoresist structure over the major surface of the substrate.

4. The fabrication process as claimed in claim 1, wherein the step of recessing the photoresist in the plurality of trenches includes removing the photoresist structure from portions of the plurality of trenches adjacent the major surface of the substrate in an anisotropic etching process.

5. The fabrication process as claimed in claim 1, wherein:
   the step of providing a substrate includes the step of disposing dielectric layers over the major surface of the substrate and over sidewalls and bottoms of the plurality of trenches; and
   the step of recessing the photoresist in the plurality of trenches includes exposing the dielectric layers over portions of the sidewalls of the plurality of trenches adjacent the major surface of the substrate.

6. The fabrication process as claimed in claim 5, wherein the step of disposing dielectric layers includes depositing a dopant containing dielectric material over the substrate.

7. The fabrication process as claimed in claim 6, further comprising the steps of:
   removing the dielectric layers over the major surface of the substrate and over the portions of the sidewalls of the plurality of trenches adjacent the major surface; and
   annealing the substrate to diffuse a dopant in the dopant containing dielectric material into the substrate adjacent the bottoms of the plurality of trenches.

8. A process for achieving a uniform recess depth in trenches, comprising the steps of:
   forming a plurality of trenches in a substrate;
   forming a photoresist structure over the substrate having a substantially uniform thickness over the substrate and filling the plurality of trenches;
   polishing the photoresist structure by chemical mechanical polishing such that a layer of photoresist having uniform thickness still remains over the substrate after polishing to achieve a substantially uniform thickness of the photoresist structure over the plurality of trenches; and
   etching away portions of the photoresist structure to remove the polished layer of photoresist from the substrate and to form recesses in the plurality of trenches, wherein the substantially uniform thickness of the photoresist structure over the plurality of trenches establishes a substantially uniform recess depth in the plurality of trenches.

9. The process as claimed in claim 8, wherein the step of polishing the photoresist structure includes substantially removing the photoresist structure over the major surface of the substrate.

10. The process as claimed in claim 8, wherein:
    the step of providing a substrate includes the step of disposing dopant containing dielectric layers over the major surface of the substrate and over sidewalls and bottoms of the plurality of trenches;
    the step of polishing the photoresist structure includes using the dopant containing dielectric layer over the major surface of the substrate as a polish stop layer; and
    the step of etching away portions of the photoresist structure includes creating recesses in the plurality of trenches to expose the dopant containing dielectric layers over portions of the sidewalls of the plurality of trenches adjacent the major surface of the substrate.

11. The process as claimed in claim 10, wherein the step of polishing the photoresist structure includes polishing the photoresist structure in a selective chemical mechanical polishing process.

12. The process as claimed in claim 10, further comprising the steps of:

removing the dopant containing dielectric layers over the major surface of the substrate and over the portions of the sidewall of the plurality of trenches adjacent the major surface; and annealing the substrate to diffuse a dopant in the dopant containing dielectric layers in the plurality of trenches into the substrate adjacent the bottoms of the plurality of tenches.

* * * * *